United States Patent
Lee et al.

(10) Patent No.: US 9,337,814 B2
(45) Date of Patent: May 10, 2016

(54) MICROWAVE PULSE GENERATOR WITH VARIABLE FREQUENCY EMISSION

(71) Applicant: ELECTRONICS AND TELECOMMUNICATIONS RESEARCH INSTITUTE, Daejeon (KR)

(72) Inventors: Hoon Lee, Hwaseong-si (KR); Sung-Hyun Kim, Daejeon (KR); Sang-Kyu Kim, Seoul (KR); Dong-Min Kim, Daejeon (KR); Kyung-Hoon Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 93 days.

(21) Appl. No.: 14/311,550

(22) Filed: Jun. 23, 2014

(65) Prior Publication Data
US 2015/0145414 A1  May 28, 2015

(30) Foreign Application Priority Data
Nov. 26, 2013  (KR) ......................... 10-2013-0144794

(51) Int. Cl.
H01J 7/24   (2006.01)
H03K 3/80   (2006.01)
H03K 3/537  (2006.01)

(52) U.S. Cl.
CPC . *H03K 3/80* (2013.01); *H03K 3/537* (2013.01)

(58) Field of Classification Search
CPC  H01J 27/16; H01J 37/32192; H01J 37/32311
USPC ................................................ 315/39, 111.01
See application file for complete search history.

(56) References Cited

U.S. PATENT DOCUMENTS

| | | | | |
|---|---|---|---|---|
| 4,875,022 A | * | 10/1989 | Berry | H03K 3/537 327/181 |
| 4,942,337 A | * | 7/1990 | Beerwald | H01T 2/00 315/325 |
| 5,587,868 A | | 12/1996 | Akutsu | |
| 7,439,677 B2 | * | 10/2008 | Dommer | H01T 9/00 315/39 |
| 7,626,468 B2 | | 12/2009 | Staines | |
| 8,901,818 B2 | * | 12/2014 | Ryu | H01J 17/04 307/106 |

(Continued)

FOREIGN PATENT DOCUMENTS

| | | |
|---|---|---|
| KR | 10-0330979 B1 | 12/2002 |
| KR | 10-0790953 B1 | 1/2008 |

(Continued)

*Primary Examiner* — Jason M Crawford
(74) *Attorney, Agent, or Firm* — LRK Patent Law Firm

(57) ABSTRACT

A variable frequency microwave pulse generator that includes a high voltage charger for charging with a high voltage, a high pressure gas tank for supplying insulation gas, and an electrode discharge unit. The electrode discharge unit includes a case, an accommodation section defined inside the case, and a pair of electrode sections disposed at one side and the other side of the accommodation section so as to face each other. The pair of electrode sections is spaced apart from each other to define a spark gap therebetween where the insulation gas supplied from the high pressure gas tank is loaded. An annular resonance recess is defined at the central portion of one electrode section of the pair of electrode sections, the depth of the resonance recess being variable in response to an adjustment knob disposed on the case being manipulated.

7 Claims, 5 Drawing Sheets

(56) References Cited

U.S. PATENT DOCUMENTS

| | | | | |
|---|---|---|---|---|
| 2003/0076044 | A1* | 4/2003 | Staines | F41H 13/0068 315/39 |
| 2004/0066117 | A1* | 4/2004 | Staines | H02N 2/183 310/339 |
| 2009/0079347 | A1* | 3/2009 | Stark | H03B 11/02 315/39 |
| 2009/0315406 | A1* | 12/2009 | Staines | H01J 25/74 307/109 |
| 2010/0001644 | A1* | 1/2010 | Stark | H03B 11/02 315/39 |
| 2013/0140985 | A1* | 6/2013 | Dommer | H01J 23/36 315/39.61 |

FOREIGN PATENT DOCUMENTS

| | | |
|---|---|---|
| KR | 10-2010-0084901 A | 7/2010 |
| KR | 10-2011-0116922 A | 10/2011 |
| KR | 10-2012-0062954 A | 6/2012 |

* cited by examiner

MICROWAVE PULSE GENERATOR WITH VARIABLE FREQUENCY EMISSION

CROSS REFERENCE TO RELATED APPLICATION

This application claims the benefit of Korean Patent Application No. 10-2013-0144794, filed on Nov. 26, 2013, which is hereby incorporated by reference in its entirety into this application.

BACKGROUND OF THE INVENTION

1. Technical Field

The present invention relates generally to a microwave pulse generator and, more particularly, to a variable frequency microwave pulse generator which includes a pair of electrodes which define a spark gap in order to generate a strong electromagnetic wave pulse, in which the central frequency of the emitted electromagnetic wave and a resultant output waveform can be adjusted.

2. Description of the Related Art

In general, strong electromagnetic wave pulse generators can be divided into a narrowband device and a wideband device depending on the frequency bandwidths. A narrowband electromagnetic wave pulse is typically generated in response to a high voltage being supplied for several tens of nanoseconds, using the movement of an electron beam that causes a high level of kinetic energy. In contrast, a wideband electromagnetic wave pulse is typically generated using spontaneous switching that causes a rise time of less than a nanosecond. The wideband electromagnetic wave pulse is a pulse having a relatively wideband frequency component proportional to a time-dependent variation rate.

Therefore, in a wideband generator, technology for a high-voltage, ultra-fast switch, which generates rapid pulse power, and technology for fabricating an antenna which efficiently radiates a wideband frequency component are very important. An impulse radiating antenna (IRA), a TEM horn antenna and the like are widely used as representative antennas.

Unlike the wideband generator in which the switch and the antenna are separately provided and are detachable, there is a structure in which the switch and the antenna can be directly coupled with each other and designed as a unitary body. Although the directivity of the antenna is limited, this structure is simple and can store electric energy while concurrently performing the functions of generating and radiating a wideband pulse. This structure can also reduce the problem of mismatch between the switch device and the antenna, so it can obtain superior efficiency. Consequently, this structure can radiate a significant intensity of an electric field.

In such a pulse generator in which a switch and an antenna are coupled, a conventional method was proposed in order to generate a varying waveform. In a wideband high-power pulse generator using a dipole antenna, there was proposed a method capable of generating waveforms having a variety of frequency signals by adjusting the length of dipoles which can be separately attached to both ends of the switch. Unlike the switch section which is operated within high pressure gas, the dipole sections are exposed and are vulnerable to dielectric breakdown with the increasing voltage. The damped sine wave characteristics in a high-frequency band occurring at a short length of the dipole change into a wide bandwidth due to the addition of a resonance component corresponding to the length when the length of the dipole is increased. Thus, there is a limit upon generating waveform having frequency-concentrated characteristics in a low frequency band.

In addition, in the conventional structure in which the antenna and the switch are designed as a unitary body, there is a structure capable of adjusting the distance between the electrodes by forming a threaded surface in one surface into which one electrode is inserted. Although the characteristics of the output waveform change in part when the distance between the electrodes is adjusted, the discharge characteristics of the spark gap switch also change. In the structure in which high pressure gas is sealed, the gas must be removed, which is inconvenient.

Also proposed is a structure in which a separate conductor rod is disposed outside the unitary structure and the distance and length of these components are adjusted to achieve variable frequency characteristics. However, the frequency bandwidth that can be varied is very small and the use of this structure is limited.

A related conventional approach includes Korean Patent Application Publication No. 10-2010-0084901 ("SPARK SWITCH GAP MODULE FOR ULTRAWIDE ELECTROMAGNETIC RADIATION," dated Jul. 28, 2010).

SUMMARY OF THE INVENTION

Accordingly, the present invention has been made keeping in mind the above problems occurring in the prior art, and an object of the present invention is to provide a high-power microwave pulse generator which has a spark gap switch and an antenna which are designed as a unitary body. The microwave pulse generator can maintain the discharge characteristics of the spark gap, which are relatively constant, while allowing the frequency characteristics of an output pulse to vary within a wide range of at least an octave bandwidth.

In order to accomplish the above object, the present invention provides a variable frequency microwave pulse generator that includes: a high voltage charger for charging with a high voltage; a high pressure gas tank for supplying insulation gas; and an electrode discharge unit. The electrode discharge unit includes a case, an accommodation section defined inside the case, and a pair of electrode sections disposed at one side and the other side of the accommodation section so as to face each other. The pair of electrode sections is spaced apart from each other to define a spark gap therebetween where the insulation gas supplied from the high pressure gas tank is loaded. An annular resonance recess is defined at the central portion of one electrode section of the pair of electrode sections, the depth of the resonance recess being variable in response to an adjustment knob disposed on the case being manipulated.

The electrode discharge unit may include: a first fixing bracket disposed at the one side of the accommodation section; a first electrode section fixed inside the accommodation section by the first fixing bracket; an electrode central section disposed at the central portion of the first electrode section; a second fixing bracket disposed at the other side of the accommodation section; a second electrode section fixed inside the accommodation section by the second fixing bracket such that the second electrode section is spaced apart from the first electrode section, the second electrode section having the resonance recess in a central portion; an electrode rod extending from the adjustment knob, which is disposed on the outer surface of the other side of the case, so as to protrude into the resonance recess; and a disk disposed around the electrode rod inside the resonance recess such that the disk is guided by the electrode rod to slide to the one side or the other side in response to the adjustment knob being rotated forward or backward.

The edges of surfaces of the first and second electrodes which face each other may be machined into curved surfaces.

The terminal end of the electrode rod may be machined into a curved surface so as to have the shape of a dome.

The variable frequency microwave pulse generator may further include O-rings disposed on outer surfaces of the first and second fixing brackets, the O-rings adjoining to inner surface portions of the case.

The edges of a surface of the disk that faces the first electrode section may be machined into a curved surface.

The electrode rod may have a spiral helix on the outer circumference, and the disk may have a thread groove in the inner circumference of a central through-hole, the thread groove conforming with the spiral helix.

The first electrode section may have an insert recess on one side, and the second electrode section may have an insert recess on the other side. Plugs of the high voltage charger are coupled into the insert recesses.

One electrode section of the pair of electrode sections may have a gas injection section connected to the high voltage gas tank.

According to the invention as set forth above, it is possible to vary the frequency characteristics of electromagnetic radiation generated during discharge between the pair of electrode sections by varying the depth of the annular resonance recess which has a specific width and is formed in at least one electrode section of the pair of electrode sections which face each other.

It is possible to vary the frequency characteristics by at least an octave bandwidth.

In addition, it is possible to maintain reliable discharge characteristics since the spark gap between the electrode sections stays constant while the depth of the resonance recess is varied.

Furthermore, it is unnecessary to remove insulation gas for the purpose of frequency variation.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
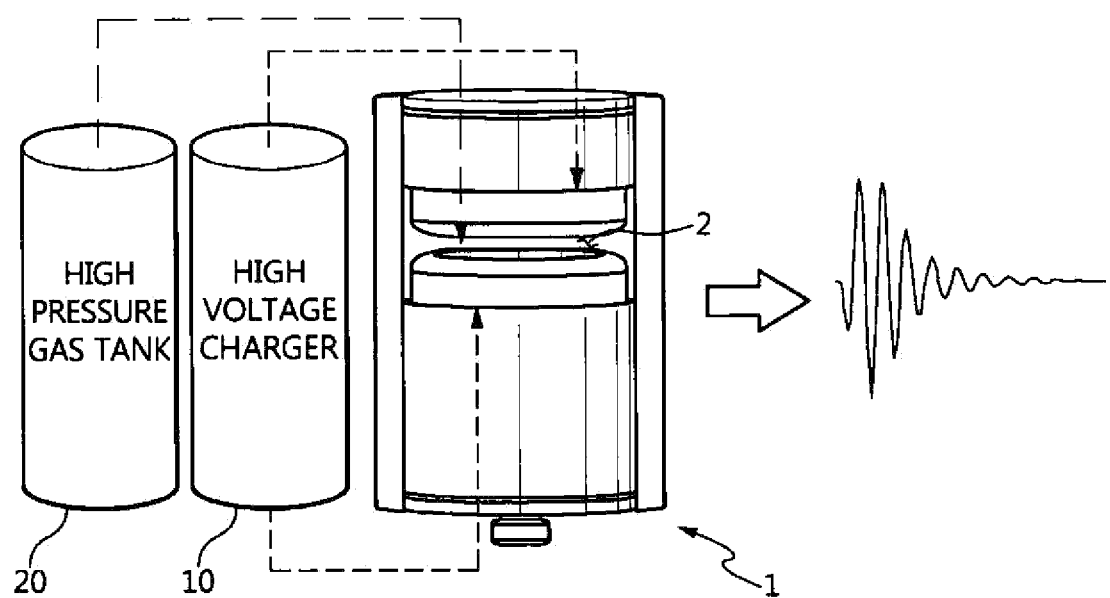
FIG. 1 is a configuration view showing a variable frequency microwave pulse generator according to the invention.

A reference will now be made in detail to the present invention in conjunction with the accompanying drawings.

In the description of the present invention, repeated descriptions and detailed descriptions of known functions and components will be omitted when they may make the subject matter of the present invention rather unclear.

Exemplary embodiments of the invention are provided so that this disclosure will more fully convey the present invention to a person skilled in the art.

In the drawings, the shapes, dimensions or the like of the components may be exaggerated for the clarity of explanation.

FIG. 1 is a configuration view showing a variable frequency microwave pulse generator according to the invention.

With reference to FIG. 1, a description will be given of the variable frequency microwave pulse generator according to the invention with reference. The variable frequency microwave pulse generator includes a high voltage charger 10 for charging with a high voltage, a high pressure gas tank 20 for supplying insulation gas, and an electrode discharge unit 1. The electrode discharge unit 1 includes a case 100, an accommodation section 110 defined inside the case 100, and a pair of electrode sections 200 disposed at one side and the other side of the accommodation section 110 so as to face each other. The pair of electrode sections 200 is spaced apart from each other to define a spark gap 2 therebetween when the insulation gas supplied from the high pressure gas tank 20 is loaded. An annular resonance recess 221 is defined at the central portion of one electrode section of the pair of electrode sections 200. The depth of the resonance recess 221 varies as an adjustment knob 130 disposed in the case 100 is manipulated.

The high voltage charger 10 and the high pressure gas tank 20 are provided separately from the electrode discharge unit 1.

A radiation waveform generated from the electrode discharge unit 1 having the configuration shown in FIG. 1 is observed using an electromagnetic field intensity sensor such as a D-dot sensor or a TEM antenna at a remote point that is several to several tens of meters from the electrode discharge unit 1.

The high voltage charger 10 generates a high voltage pulse from a supply voltage using a Marx generator, a Tesla transformer, or the like. The high voltage charger 10 is connected to the electrode discharge unit 1 via a high voltage cable. A high voltage supplied from the high voltage charger 10 allows the electrode discharge unit 1 to be spontaneously discharged.

The high pressure gas tank 20 allows insulation to be maintained to a preset voltage in order to increase a voltage resulting from the spontaneous discharge of the electrode discharge unit 1. A gas such as nitrogen or $SF_6$ is typically used.

Figure 2:
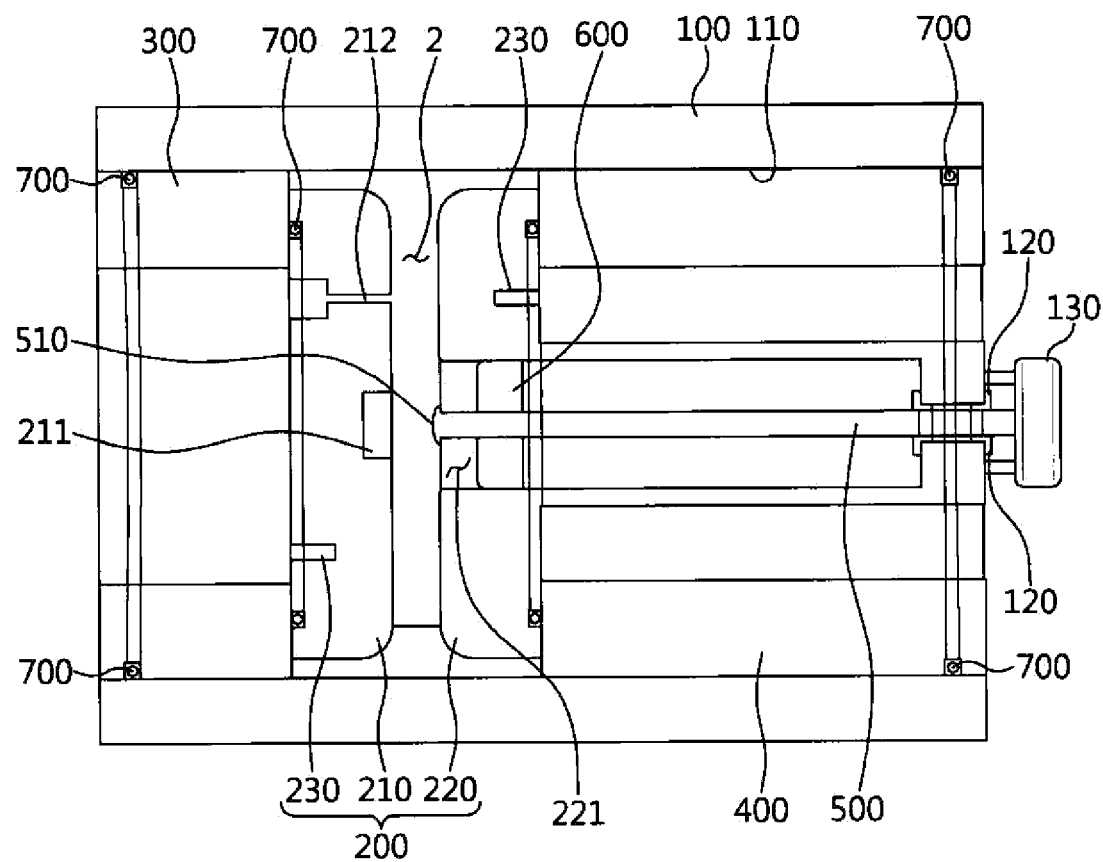
FIG. 2 is a cross-sectional view showing the inside of an electrode discharge unit according to the invention.
Figure 3:
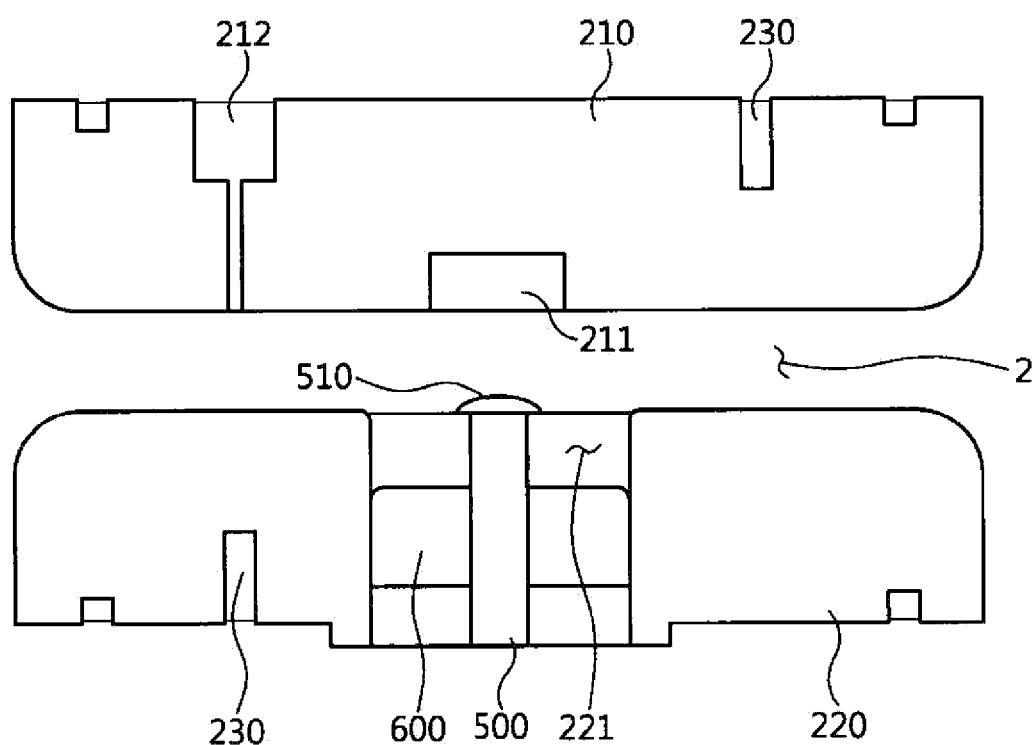
FIG. 3 is an enlarged view showing a pair of electrode units shown in FIG. 2.

FIG. 2 is a cross-sectional view showing the inside of an electrode discharge unit according to the invention, and FIG. 3 is an enlarged view showing a pair of electrode sections 200 shown in FIG. 2.

The electrode discharge unit 1 will be described in greater detail with reference to FIG. 2 and FIG. 3. A case 100 of the electrode discharge unit 1 is divided into one side and the other side depending on the lengthwise direction. A first electrode bracket 300 is provided at one side of an accommodation section 110 inside the case 100. A first electrode section 210 is fixed inside the accommodation section 110 by the first fixing bracket 300, and an electrode center section 211 is provided at the center of the first electrode section 210.

The electrode discharge unit 1 further includes a second fixing bracket 400 which is disposed at the other side of the accommodation section 110 opposite the first fixing bracket 300 inside the accommodation section 110; a second electrode section 220 which is fixed inside the accommodation section 110 by the second fixing bracket 400 such that the second electrode section 220 is spaced apart from the first electrode section 210, the second electrode section 220 having the resonance recess 221 in the central portion; an electrode rod 500 which extends from the adjustment knob 130, which is disposed on the outer surface of the other side of the case 100, through the case 100, the second fixing bracket 400 and the second electrode 220 and protrudes into the resonance recess 221; and a disk 600 is disposed around the electrode rod 500 inside the resonance recess 221 such that the disk 600 is guided by the electrode rod 500 to slide to one side or the other side when the adjustment knob 130 is rotated forward or backward.

The case 100 contains the electrode section 210 and the second electrode section 220 in the accommodation section 110 which is provided inside the case 100. The case 100 is designed such that it can provide airtightness while withstanding a pressure from high pressure insulation gas that is contained in the spark gap 2, i.e. the space where the first and second electrode sections 210 and 220 are spaced apart from each other.

According to the invention, it is preferred that the case 100 be made of a cylindrical dielectric body that does not interfere with radiation of signals.

The first and second electrode sections 210 and 220 can be fixed by the first and second fixing brackets 300 and 400 according to this exemplary embodiment, or can be directly coupled to the case 100 depending on the shape of the design.

Each of the first second fixing brackets 300 and 400 has an O-ring 700 which surrounds the outer surface thereof and adjoins to the inner surface of the case 100 inside the accommodating part 110. This consequently provides airtightness, thereby preventing the insulation gas from leaking.

The first and second electrode sections 210 and 220 form a potential difference due to the high voltage from the high voltage charger 10, and are spaced apart from each other such that they face each other. The surfaces of first and second electrode sections 210 and 220 that face each other are formed flat in order to further enhance energy storage capability.

Insert recesses 230 are formed in the first and second electrode sections 210 and 220. An anode ray plug (not shown) and a canal ray plug (not shown) withdrawn from the high voltage charger 10 are inserted into the insert recesses 230 in order to provide electrical energy from the high voltage charger 10.

A gas injection section 212 through which the insulation gas is supplied extends through one of the pair of electrode sections 200, more particularly, the first electrode section 210 according to this exemplary embodiment, in order to supply the insulation gas into the spark gap 2, i.e. the space where the first and second electrode sections 210 and 220 are spaced apart from each other.

The annular resonance recess 221 is formed in the central portion of the second electrode section 220.

The electrode rod 500 extending through the other side of the case 100 is disposed at the center of the resonance recess 221. The disk 600 through the center of which the electrode rod 500 extends is disposed adjoining to the inner circumference of the resonance recess 221 such that the disk 600 can slide along the lengthwise direction.

That is, the frequency is variable depending on the depth of the resonance recess 221 in response to the sliding of the disk 600.

This is enabled in response to the manipulation of the adjustment knob 130 provided on the outer surface of the other side of the case 100. Since the frequency is varied in response to the manipulation of the adjustment knob 130 provided on the outer surface of the electrode discharge unit 1 in this manner, it is possible to vary the frequency without discharging the insulation gas loaded in the spark gap 2.

The electrode rod 500 is typically made of a Cu—W alloy material considering corrosion caused by the discharge and electric conductivity.

According to this exemplary embodiment, an electrode protrusion 510 is formed at the terminal end of the electrode rod 500. Considering that the electrode protrusion 510 is not provided in the electrode, it is advantageous in terms of cost and weight that the first and second electrode sections 210 and 220 are made of an aluminum material and only the central portion of the electrode is made of a Cu—W alloy material.

Spiral helices (not shown) are formed on the outer circumference of the electrode 500, and thread grooves (not shown) which conform with the spiral helices are formed in the inner circumference of a central through-hole of the disk 600 through which the electrode rod 500 extends. With this configuration, the disk 600 can be displaced in response to the manipulation of the adjustment knob 130.

In order to prevent the insulation gas from leaking, the outer surface of the disk 600 and the inner surface of the resonance recess 221 are designed such that they can be in close contact with each other to maintain airtightness.

In addition, a sealing member such as a bearing bushing 120 is provided on the portion of the case 100 through which the electrode rod 500 extends in order to help the electrode rod 500 rotate and provide airtightness to the electrode rod 500.

According to the invention, the edges of the surfaces of the first and second electrodes 210 and 220 which face each other are machined into curved surfaces, as shown in FIG. 2 and FIG. 3.

The electrode protrusion 510, or the terminal end of the electrode rod 500, is also machined into a curved surface such that the electrode protrusion 510 has the shape of a dome. All edges of the surface of the disk 600 which faces the first electrode 210 are machined into a curved surface.

Since the first and second electrode sections 210 and 220, the terminal end of the electrode rod 500 which faces the central portion of the electrode and the disk 600 are machined into curved surfaces, there is an effect of causing discharge from the central portions of the first and second electrode sections 210 and 220 inside the spark gap 2.

Figure 4:
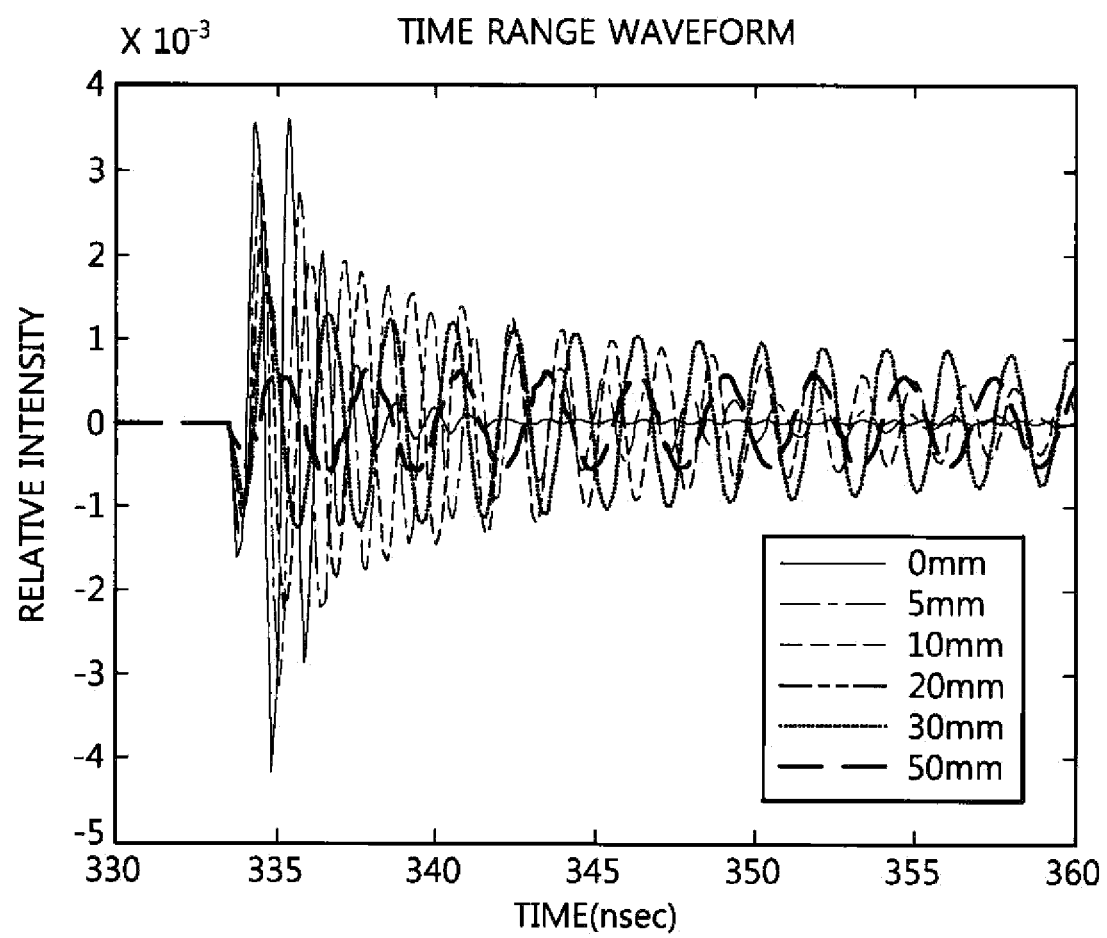
FIG. 4 is a waveform graph showing the relative intensities of electromagnetic fields depending on the depth of a resonance recess according to the invention.

FIG. 4 is a waveform graph showing the relative intensities of electromagnetic fields depending on the depth of a resonance recess according to the invention.

When the disk 600 moves toward one side inside the resonance recess 221, i.e. toward the terminal end of the electrode rod 500, in response to forward rotation of the adjustment knob 130, it is apparent that the maximum intensity of the received electric field increases but the duration time decreases with the decreasing depth of the resonance recess 221.

In contrast, when the disk 600 moves toward the other side in response to reverse rotation of the adjustment knob 130, it is possible to confirm the output of a damped sine wave signal in which the maximum intensity of the received electric field decreases but the duration time increases with the increasing depth of the resonance recess 221.

Figure 5:
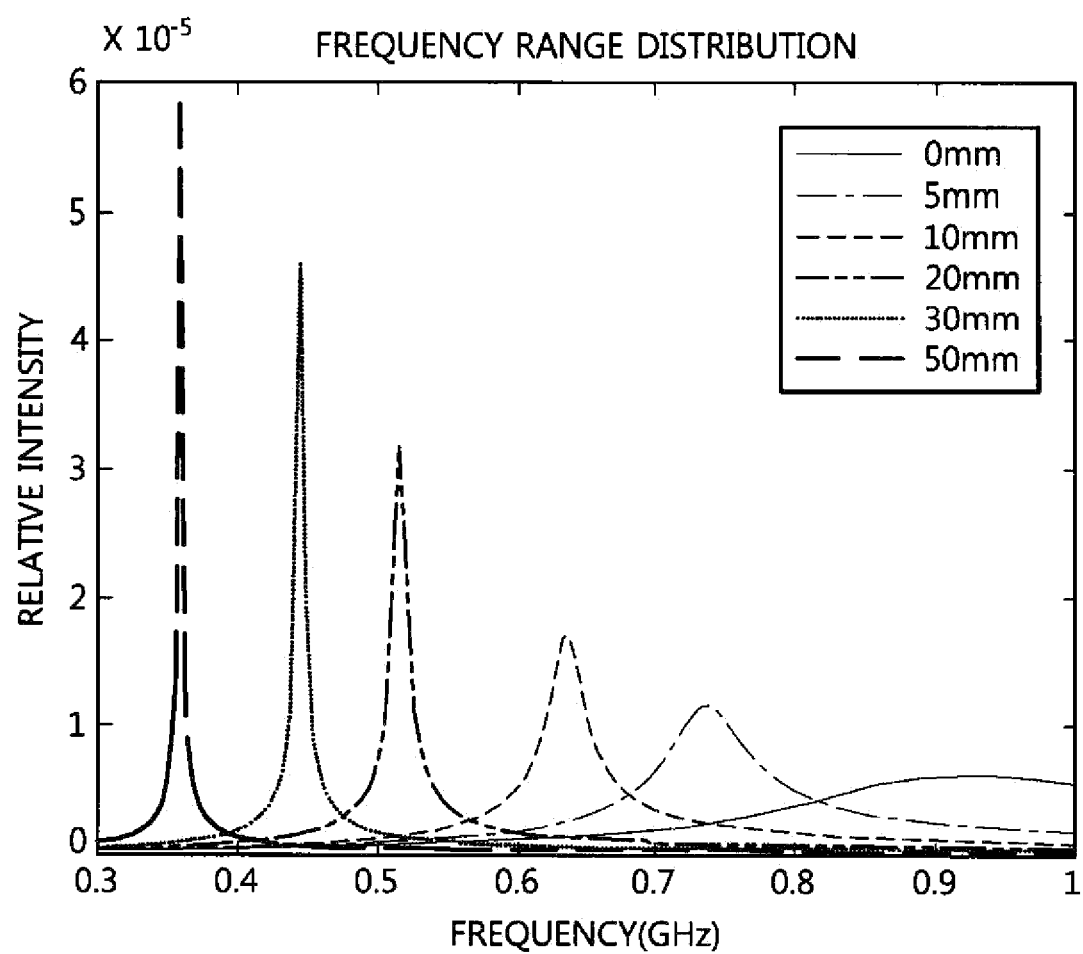
FIG. 5 is a graph showing the waveforms of electromagnetic fields depending on the depth of the resonance recess according to the invention, converted into frequency spectra.

FIG. 5 is a graph showing the waveforms of electromagnetic fields depending on the depth of the resonance recess 221 according to the invention, converted into frequency spectra. It is apparent that the high-frequency component is higher and the band is wider as the depth of the resonance recess 221 is decreased in response to the disk 600 sliding toward one side. As the depth of the resonance recess 221 is increased in response to the disk 600 sliding toward the other side, the output is concentrated at a low frequency.

If the thickness corresponding to the length from one side to the other side of the first and second electrode sections 210 and 220 is smaller, it is possible to output a damped sine wave signal that is more concentrated when generating a high-frequency signal.

As set forth above, since the depth of the resonance recess 221 is adjusted, the central frequency that varies in response to the adjustment knob 130 being manipulated can have a range at least an octave bandwidth.

In addition, although the depth of the resonance recess 221 is varied, the pressure of the insulation gas inside the spark gap 2 and the distance between the first and second electrode sections 210 and 220 stay constant. The spark gap 2 can consequently maintain the discharge characteristics that are relatively reliable.

Although the specific embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A variable frequency microwave pulse generator comprising:
    a high voltage charger for charging with a high voltage;
    a high pressure gas tank for supplying insulation gas; and
    an electrode discharge unit comprising a case, an accommodation section defined inside the case, and a pair of electrode sections disposed at one side and the other side of the accommodation section so as to face each other, the pair of electrode sections being spaced apart from each other to define a spark gap therebetween where the insulation gas supplied from the high pressure gas tank is loaded,
    wherein an annular resonance recess is defined at a central portion of one electrode section of the pair of electrode sections, a depth of the resonance recess being variable in response to an adjustment knob disposed on the case being manipulated, and
    wherein the electrode discharge unit comprises:
    a first fixing bracket disposed at the one side of the accommodation section;
    a first electrode section fixed inside the accommodation section by the first fixing bracket;
    an electrode central section disposed at a central portion of the first electrode section;
    a second fixing bracket disposed at the other side of the accommodation section;
    a second electrode section fixed inside the accommodation section by the second fixing bracket such that the second electrode section is spaced apart from the first electrode section, the second electrode section having the resonance recess in a central portion;
    an electrode rod extending from the adjustment knob, which is disposed on an outer surface of the other side of the case, so as to protrude into the resonance recess; and
    a disk disposed around the electrode rod inside the resonance recess such that the disk is guided by the electrode rod to slide to the one side or the other side in response to the adjustment knob being rotated forward or backward.

2. The variable frequency microwave pulse generator according to claim 1, wherein edges of surfaces of the first and second electrodes which face each other are machined into curved surfaces.

3. The variable frequency microwave pulse generator according to claim 1, wherein a terminal end of the electrode rod is machined into a curved surface so as to have a shape of a dome.

4. The variable frequency microwave pulse generator according to claim 1, further comprising O-rings disposed on outer surfaces of the first and second fixing brackets, the O-rings adjoining to inner surface portions of the case.

5. The variable frequency microwave pulse generator according to claim 1, wherein edges of a surface of the disk that faces the first electrode section are machined into a curved surface.

6. The variable frequency microwave pulse generator according to claim 1, wherein the electrode rod has a spiral helix on an outer circumference, and the disk has a thread groove in an inner circumference of a central through-hole, the thread groove conforming with the spiral helix.

7. The variable frequency microwave pulse generator according to claim 1, wherein the first electrode section has an insert recess on one side, and the second electrode section has an insert recess on the other side, plugs of the high voltage charger being coupled into the insert recesses.

\* \* \* \* \*